(12) United States Patent
Pasotti et al.

(10) Patent No.: US 6,473,340 B1
(45) Date of Patent: Oct. 29, 2002

(54) READING METHOD AND CIRCUIT FOR A NON-VOLATILE MEMORY

(75) Inventors: Marco Pasotti, S. Martino Siccomario; Giovanni Guaitini, Trecella; Pier Luigi Rolandi, Monleale; Guido De Sandre, Brugherio, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 124 days.

(21) Appl. No.: 09/699,043

(22) Filed: Oct. 27, 2000

(30) Foreign Application Priority Data

Oct. 29, 1999 (IT) ......................................... TO99A0944

(51) Int. Cl.⁷ ............................................. G11C 13/00
(52) U.S. Cl. ............................ 365/185.21; 365/185.03; 365/185.2
(58) Field of Search ...................... 365/185.21, 185.01, 365/185.18, 185.2, 185.03

(56) References Cited

U.S. PATENT DOCUMENTS

| | | | | |
|---|---|---|---|---|
| 5,091,888 A | * | 2/1992 | Akaogi | 365/210 |
| 5,335,198 A | * | 8/1994 | Van Buskirk et al. | 365/185 |
| 5,701,265 A | * | 12/1997 | Calligaro et al. | 365/185.03 |
| 5,773,997 A | * | 6/1998 | Stieger | 327/53 |
| 5,917,753 A | * | 6/1999 | Dallabora et al. | 365/185.21 |
| 5,973,959 A | * | 10/1999 | Gerna et al. | 365/185.03 |
| 6,034,888 A | * | 3/2000 | Pasotti et al. | 365/185.03 |
| 6,081,448 A | * | 6/2000 | Passoti et al. | 365/185.03 |
| 6,128,228 A | * | 10/2000 | Pasotti et al. | 365/185.21 |
| 6,292,398 B1 | * | 9/2001 | Pasotti et al. | 365/185.21 |

* cited by examiner

Primary Examiner—Richard Elms
Assistant Examiner—Hien Nguyen
(74) Attorney, Agent, or Firm—Lisa K. Jorgenson; Robert Iannucci; Seed IP Law Group PLLC (57) ABSTRACT

A reading circuit having an array branch connected via an array bit line to an array memory cell, the content of which is to be read; a reference branch connected via a reference bit line to a current generator stage supplying a reference current; a current/voltage converter stage connected to the array branch and to the reference branch, and supplying at an array node and at a reference node respectively an array potential and a reference potential, which are correlated to the currents flowing respectively in the array branch and in the reference branch; a comparator stage connected to the array node and the reference node for comparing the array and reference potentials; a sample and hold stage arranged between the array node and the comparator stage and selectively operable to sample and hold the array potential; and a switching off stage for switching off the array branch.

25 Claims, 3 Drawing Sheets

READING METHOD AND CIRCUIT FOR A NON-VOLATILE MEMORY

TECHNICAL FIELD

The present invention relates to a reading method and a circuit for a nonvolatile memory.

BACKGROUND OF THE INVENTION

As is known, in a floating gate non-volatile memory cell storage of a logic state is carried out by programming the threshold voltage of the cell itself through the definition of the quantity of electrical charge stored in the floating gate region.

Reading of a memory cell is carried out using a read circuit known as "sense amplifier," which, in addition to recognizing the logic state stored in the memory cell, also provides for the correct biasing of the drain terminal of the memory cell.

Figure 1:
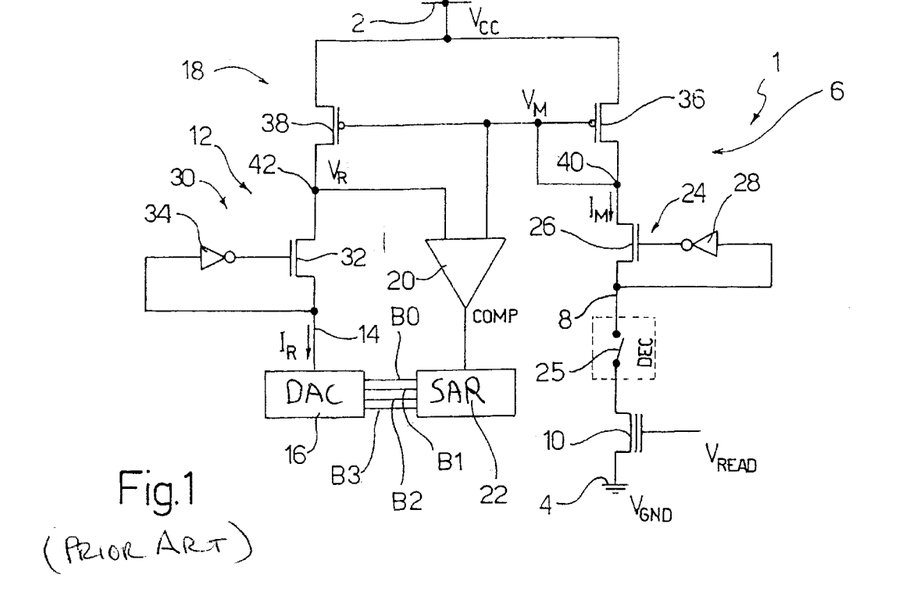
FIG. 1 shows a sense amplifier according to the known prior art.

FIG. 1 illustrates by way of example a known sense amplifier used to read multi-level flash memory cells.

The sense amplifier, indicated as a whole by 1, is a successive approximation sense amplifier comprising a supply line 2 set to the supply voltage $V_{CC}$; a ground line 4 set to the ground voltage $V_{GND}$; an array branch 6 connected via an array bit line 8 to a non-volatile memory cell 10, the content of which is to be read; a reference branch 12 connected via a reference bit line 14 to a digital/analog converter (DAC) 16, which draws at an output a reference current $I_R$; a current/voltage converter stage 18 connected to the array and reference branches 6, 12 for converting the currents flowing in these branches respectively into an array potential $V_M$ and a reference potential $V_R$; a differential comparator stage 20 for comparing the array and reference potentials $V_M$ and $V_R$ and supplying at an output a logic comparison signal COMP indicative of the result of the comparison; and an n-bit successive approximation register (SAR) 22, wherein n is the number of bits stored in the memory cell 10, having an input connected to the output of the comparator stage 20, and a plurality n of outputs connected to respective inputs of the digital/analogue converter 16, for driving the digital/analogue converter 16 in order to vary the reference current $I_R$ required by the converter at the output, in the manner described in detail hereinafter.

In the example illustrated, the memory cell 10 to be read is a multi-level memory cell in which four bits (16 levels) are stored, and has a gate terminal receiving a reading signal $V_{READ}$, a drain terminal connected to the array bit line 8, and a source terminal connected to the ground line 4.

In the example illustrated, the successive approximation register 22 is consequently a four-bit register, and has four outputs, each of which is associated with a respective bit, and at which it supplies four control signals, indicated as B3, B2, B1 and B0, assuming a logic level correlated to the logic value assumed by the corresponding bit.

The array branch 6 comprises an array biasing stage 24 for biasing the drain terminal of the memory cell 10 to a predetermined potential, typically 1V; and an array column decoding stage, for the sake of simplicity schematized in FIG. 1 by means of a switch 25, arranged between the array biasing stage 24 and the array bit line 8, and typically formed of three series-connected NMOS transistors (not shown) receiving respective column decoding signals at gate terminals.

In particular, the array biasing stage 24 has a negative feedback cascode structure formed of a NMOS transistor 26 and a logic inverter 28; the NMOS transistor 26 has a drain terminal connected to the current/voltage converter stage 18, a source terminal connected to the array bit line 8 and to the input terminal of the logic inverter 28, and a gate terminal connected to the output terminal of the logic inverter 28. With this configuration, the electrical potential of the drain terminal of the memory cell 10 is approximately equivalent to the threshold voltage of the logic inverter 28, at which potential, in other words, the logic inverter 28 switches from one logic level to the other.

The reference branch 12 comprises a reference biasing stage 30 altogether identical to the array biasing stage 24, and having a feedback cascode structure formed of an NMOS transistor 32 and a logic inverter 34; the NMOS transistor 32 has a drain terminal connected to the current/voltage converter stage 18, a source terminal connected to the reference bit line 14 and to the input terminal of the logic inverter 34, and a gate terminal connected to the output terminal of the logic inverter 34.

The reference branch 12 additionally comprises a reference column decoding stage (not shown), arranged between the reference biasing stage 30 and the reference bit line 14, formed of three series-connected NMOS transistors kept continually switched on (typically by connecting their gate terminals to the supply line 2), and having the purpose of making the structure of the reference branch 12 and the array branch 6 symmetrical with one another.

The current/voltage converter stage 18 is formed of a current mirror comprising a first diode-connected PMOS transistor 36 arranged on the array branch 6, and a second PMOS transistor 38 arranged on the reference branch 12; in particular, the PMOS transistors 36 and 38 have gate terminals connected to one another and to the drain terminal of the PMOS transistor 36, source terminals connected to the supply line 2, and drain terminals connected respectively to the drain terminals of the NMOS transistor 26 and the NMOS transistor 32, and defining respectively an array node 40 and a reference node 42, at which the aforementioned array potential $V_M$ and reference potential $V_R$, respectively, are present and to which the two input terminals of the comparator stage 20 are connected.

The sense amplifier 1 operates as follows. When a constant reading voltage $V_{READ}$, having a value greater than the highest threshold voltage which can be programmed in the memory cell 10, is applied to the gate terminal of the memory cell 10, and provided that the drain terminal of the memory cell 10 is kept at a sufficiently low, constant value of approximately 1 V, the memory cell 10 works in the triode operating zone, and draws an array current $I_M$ which is inversely proportional to the threshold voltage programmed, i.e., the higher its threshold voltage, the lower the current flowing in it.

The array current $I_M$ is mirrored onto the reference node 42 by the PMOS transistors 36 and 38 of the current mirror 18, and in the reference node 42 the reference current $I_R$ drawn by the digital/analogue converter 16 is subtracted from this mirrored current.

The array potential $V_M$ and the reference potential $V_R$ of the array node 40 and the reference node 42, respectively, are thus correlated respectively to the array current $I_M$, and to the difference between the reference current $I_R$ and the array current $I_M$ mirrored onto the reference branch 12, and these potentials are compared with one another by the comparator stage 20, which supplies at an output the comparison signal COMP, which assumes a first logic level if $V_M$ is greater than $V_R$, and a second, low logic level, if $V_M$ is smaller than $V_R$.

The comparison signal COMP is then supplied to the successive approximation register 22, which, on the basis of the logic level of this signal, modifies the logic level of the control signals B3–B0, by implementing a dichotomous algorithm, which is known and therefore described briefly hereinafter.

In particular, the successive approximation register 22 controls the digital/analogue converter 16 such as to vary by steps the reference current $I_R$ drawn by the converter on the basis of the logic level assumed by the comparison signal COMP. In detail, as soon as the gate terminal of the memory cell 10 is supplied with the reading signal $V_{READ}$, the successive approximation register 22 is controlled such as to set the control signal B3 to the high logic level (most significant bit set to "1"). Consequently, the digital/analogue converter 16 draws a reference current $I_R$ having a value equivalent to half the maximum value which it can supply (i.e., a value which is correlated to the weight of the most significant bit which has been set to "1"), and this current begins to flow in the reference branch 12.

If the reference current $I_R$ is lower than the array current $I_M$ mirrored onto the reference branch 12, the potential $V_R$ varies towards values which are greater than those of the array potential $V_M$, and the logic level consequently assumed by the comparison signal COMP controls the successive approximation register 22 such as to set the control signal B2 also to the high logic level (second most significant bit set to "1"), whereas if the reference current $I_R$ is greater than the array current $I_M$ mirrored onto the reference branch 12, the potential $V_R$ varies towards values which are lower than those of the array potential $V_M$, and the logic level consequently assumed by the comparison signal COMP controls the successive approximation register 22 such as to set the control signal B3 to the low logic level (most significant bit set to "0"), and the control signal B2 to the high logic level (second most significant bit set to "1").

In the first case, the reference current $I_R$ drawn by the digital/analogue converter 16 is consequently incremented by a value equivalent to one quarter of the maximum value which can be supplied (i.e., by a value correlated to the weight of the second most significant bit which has been set to "1"), and thus in total it assumes a value equivalent to three quarters of the maximum current which can be supplied, whereas in the second case, the reference current $I_R$ drawn by the digital/analogue converter 16 assumes a value equivalent to one quarter of the maximum value which can be supplied.

The comparison is then carried out once more between the new values assumed by the array and reference potentials $V_M$ and $V_R$, and consequently the logic level of the control signals B3–B0 is modified, and by proceeding in this manner with successive approximations, at each comparison step there is determination of the value of one of the four bits stored in the memory cell 10 (dichotomous algorithm), and therefore the four bits stored in the memory cell 10 are written in four steps into the successive approximation register 22.

The main disadvantage of the known sense amplifiers is their high current consumption, particularly when the memory cell to be read is blank, or has a low threshold voltage. In fact, in these cases, the high reading voltage $V_{READ}$ supplied to the gate terminal of the memory cell to be read, together with the low threshold voltage of the memory cell, causes the current flowing in the memory cell itself to assume a rather high value, approximately 50 $\mu$A, which, when multiplied by the number of sense amplifiers which generally operate simultaneously in order to carry out parallel reading of several memory cells, gives rise to overall consumption which in some applications can be unacceptable.

The considerations described above for successive approximation sense amplifiers dedicated to reading of multi-level memory cells, also apply equally well to sense amplifiers dedicated to reading of flash memory cells, in which a single bit is stored, and in which the reference current $I_R$ is constant and generated by means of a reference memory cell having a known content.

SUMMARY OF THE INVENTION

An embodiment of the present invention provides a reading method and circuit for a non-volatile memory, which permit reduction of current consumption, compared with that of reading circuits according to the known prior art.

The reading circuit includes having a first branch coupled to a first current generator; a second branch connected to a second current generator; a current/voltage converter connected to the first and second branches and supplying at a first and second node respectively a first and a second electrical potential, correlated to currents flowing respectively in the first and second branches; and a comparator having first and second inputs coupled respectively to the first and second nodes for comparing the first and second electrical potentials; a sample and hold circuit arranged between the first node and the comparator, the sample and hold circuit selectively operable to sample and hold the first potential; and a switch for switching off the first branch.

According to one aspect of the invention, the reading circuit is formed of an array branch coupled via an array bit line to an array memory cell, the content of which is to be read; a reference branch coupled via a reference bit line to a current generator stage, which supplies a reference current; a current/voltage converter stage connected to the array branch and to the reference branch, which supplies at an array node and at a reference node respectively an array potential and a reference potential, which are correlated to the currents flowing respectively in the array branch and in the reference branch; a comparator stage coupled to the array node and to the reference node for comparing the array and reference potentials; a sample and hold stage arranged between the array node and the comparator stage and selectively operable to sample and hold the array potential; and a switching off stage for switching off the array branch.

According to another aspect of the invention, a reading circuit for a non-volatile memory is provided wherein the inventive principle on which the present invention is based is applied without any modification to sense amplifiers in which it is the reference current which is reflected onto the array branch. Accordingly, the sample and hold stage is positioned between the reference node and the input terminal of the comparator stage to which this reference node is connected, and a switch for switching off the reference branch is provided.

According to other aspects of the present invention, a reading method for a non-volatile memory is also provided, wherein the reading method is implemented by means of a reading circuit having a first branch in which a first current flows, and a second branch in which a second current flows. The reading method converting the first current into a first electrical potential; converting the second current into a second electrical potential; comparing said first and second electrical potentials; sampling and holding the first electrical potential; and switching off the first branch of the reading circuit.

According to one aspect of the method of the invention, the first branch is an array branch and the second branch is a reference branch.

According to another aspect of the invention, the method for a reading circuit is implemented by means of a reading circuit also having a memory cell connected to the first branch, wherein the switching off the first branch of the reading circuit also includes switching off the memory cell.

According to yet another aspect of the invention, the method also includes zeroing a reading voltage supplied to a gate terminal of the memory cell.

BRIEF DESCRIPTION OF THE DRAWINGS

In order to assist understanding of the present invention, four preferred embodiments are now described, purely by way of non-limiting example, and with reference to the attached drawings, in which.

DETAILED DESCRIPTION OF THE INVENTION

The present invention is based on the finding that the high consumption of sense amplifiers of the type previously described is caused, inter alia, partially by the fact that the array current $I_M$ is reflected onto the reference branch 12, and thus, in these sense amplifiers, there are two current paths in which power is dissipated.

In reality, however, in order for the array current $I_M$ to be mirrored correctly onto the reference branch 12, it is not necessary for the current to flow in the PMOS transistor 36 throughout the duration of the reading phase, but it is sufficient for the voltage present between the gate terminal and the source terminal of the PMOS transistor 38 to assume the appropriate value to make this current flow.

Thus, when this voltage assumes the value necessary in order to carry out correct mirroring of the array current $I_M$ onto the reference branch 12, it is sufficient to sample this voltage and keep it unvaried over a period of time, and to "switch off" the array branch 6, with consequent reduction of the energy consumption.

In particular, according to the present invention, the sense amplifier is provided with a sampling and holding stage, which is generally known as "sample and hold stage," and since the memory cell to be read can be assimilated to a voltage/current converter block (reading voltage $V_{READ}$/array current $I_M$), the reading voltage $V_{READ}$ is applied to the gate terminal of the memory cell 10 for sufficient time to make stable the voltage present between the gate terminal and the source terminal of the PMOS transistor 38.

This voltage is then sampled and held by the sample and hold stage, and since the blocks which precede this stage are no longer necessary, the latter are switched off, and the reading voltage $V_{READ}$ supplied to the gate terminal of the memory cell 10 is zeroed. By this means, all the components which precede the sample and hold stage no longer dissipate electrical power, and the gate terminal of the memory cell to be read (and together with the latter also all the gate terminals of the memory cells which belong to the same line) is no longer subjected to the stress derived from the application of high voltages.

Figure 2:
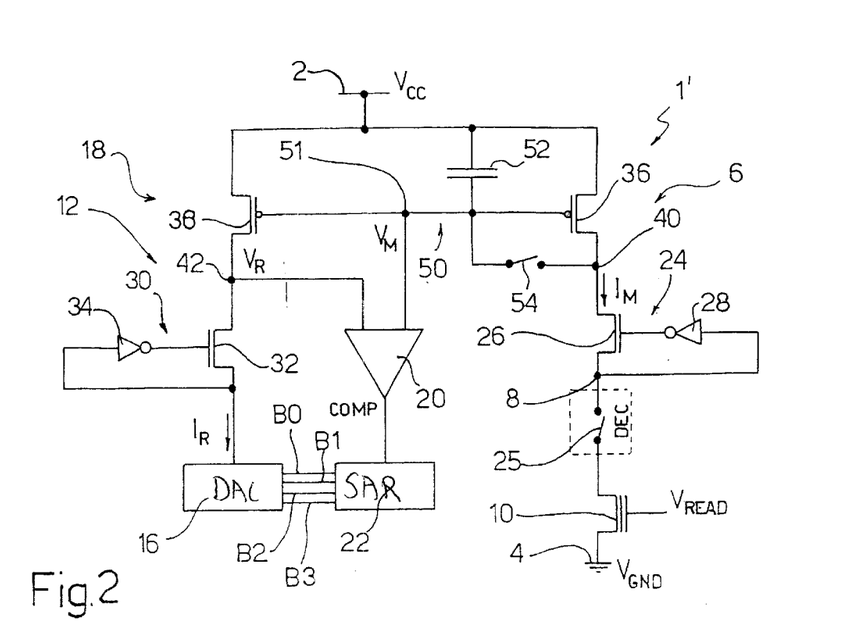
FIG. 2 shows a sense amplifier according to a first embodiment of the present invention.

FIG. 2 shows a sense amplifier according to a first embodiment of the present invention, which implements the above-described inventive principle.

The sense amplifier, which is indicated as a whole by 1', has a circuit structure similar to that of the sense amplifier 1 previously described, such that identical parts will be indicated by the same reference numbers.

In particular, the sense amplifier 1' differs from the sense amplifier 1 in that it also comprises a sample and hold stage 50 arranged between the array node 40 and the corresponding input terminal of the comparator stage 20, indicated as 51 in FIG. 2, and comprising a capacitor 52 arranged between the supply line 2 and the gate terminal of the PMOS transistor 36 of the current/voltage converter stage 18; and a controlled switch 54 connected between the gate terminal (node 51) and the drain terminal of the PMOS transistor 36 of the current/voltage converter stage 18 (array node 40), instead of the shortcircuit defining the diode-connection of the PMOS transistor 36.

The switch 54 can advantageously be formed of a MOS transistor, which receives at its gate terminal a control signal Si for controlling opening and closure of the switch 54 itself, and for example generated by a suitably programmed microcontroller.

The sense amplifier 1' operates as follows. When the memory cell 10 is connected to the sense amplifier 1' for the first time (switch 25 closed), the control signal S1 controls closure of the switch 54, such that the array current $I_M$ flows in the PMOS transistor 36, and consequently charges the capacitor 52. In this phase, the sense amplifier 1' has a circuit structure which is altogether identical to that of the sense amplifier 1 previously described.

After a period of time which is sufficient to charge the capacitor 52, the control signal SI switches in order to control opening of the switch 54. Simultaneously, the array branch 6 is switched off, thus controlling opening of the switch 25 (i.e., controlling opening of the NMOS transistors of the array column decoding stage). In addition, the reading voltage $V_{READ}$ supplied to the gate terminal of the memory cell 10 is zeroed, such as to prevent this terminal (and together with the latter also all of the terminals of the memory cells which belong to the same line) from being subjected to the stress derived from the application of high voltages.

If the switch 54 were ideal, the electrical charge stored in the capacitor 52 would remain trapped, and consequently the voltage present at the gate terminals of the PMOS transistors 36, 38 (node 40) would be constant, and such as to give rise to flowing in the PMOS transistor 36 of exactly the current which was flowing initially in the memory cell 10.

At the same time, however, the circuit portion comprising the array branch 6, the memory cell 10 and the PMOS transistor 36 is switched off, and thus its contribution to the overall energy consumption of the sense amplifier 1' is zeroed.

In reality, however, since the switch 54 is not ideal but real, there will be at least two types of non-ideal situations:

the first is caused by the injection of charge at the capacitor 52, which gives rise to a small variation of the electrical potential $V_M$ of the node 40, after the switch 54 has been opened, compared with the value which exists before opening, but this contribution can be considered as a systematic contribution to the reading error, and can therefore be eliminated, by taking this into account in programming; in fact, during programming of the memory cell 10, the sense amplifier 1' is also used in order to carry out the checking phase, and thus, since the injection of charge is also present in this phase, the programmed value already takes into account the error which will occur each time the memory cell 10 is read; and the second is caused by the small leakage current which tends to discharge the capacitor 52 over a period of time, but its effect can be ignored, provided that the reading phase is carried out sufficiently quickly.

In the sense amplifier 1' according to the present invention, the method for reading the content of the memory cell 10 takes place in a manner which is virtually identical to that previously described for the sense amplifier 1, and therefore it will not be repeated.

However, the fact is emphasized that unlike the sense amplifier 1, in which the phase of successive approximation of the value of the reference current $I_R$ is carried out with both the array branch 6 and the referee branch 12 switched on, in the sense amplifier 1' according to the present invention, this phase is carried out, after the initial charging transient of the capacitor 52, with the array branch 6 switched off, and this ensures that the energy saving which can be obtained by means of the sense amplifier 1' tends towards a theoretical limit value of 50%, which however cannot be obtained in practice, owing to the power which must be dissipated in order to charge the capacitor 52.

Reduction of the energy consumption is also obtained without particular disadvantages from the point of view of the reading speed, compared with the known sense amplifiers.

In the circuit configuration of the sense amplifier 1' shown in FIG. 2, it would also be possible to eliminate the logic inverters 28, 24 and to apply to the gate terminals of the NMOS transistors 26, 32 a suitably generated reference voltage.

Figure 3:
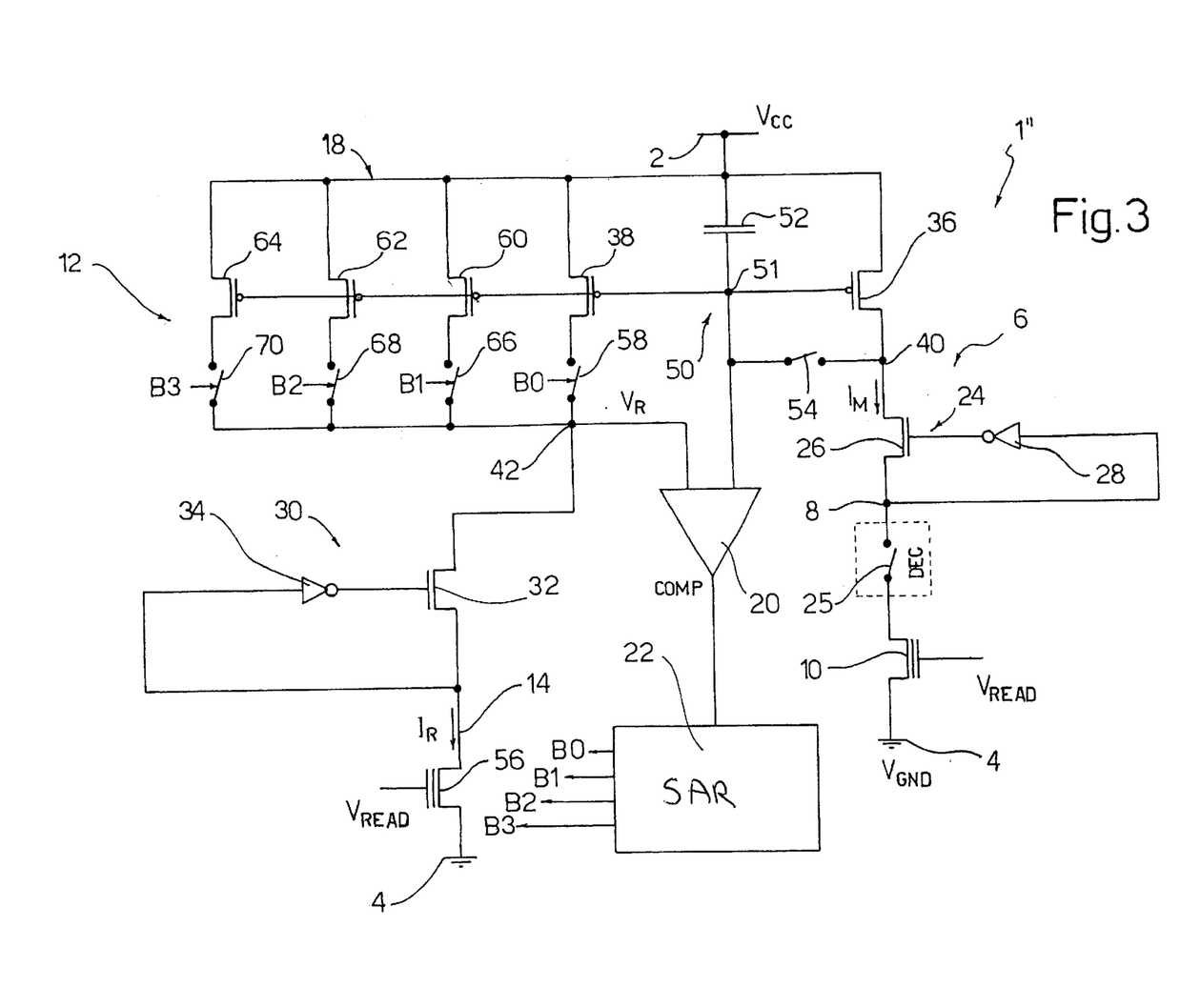
FIG. 3 shows a sense amplifier according to a second embodiment of the present invention.

FIG. 3 shows a sense amplifier according to a second embodiment of the present invention.

The sense amplifier, which indicated as a whole by 1", has a circuit structure which is partially similar to that of the sense amplifier 1' previously described, such that identical parts will be indicated with the same reference numbers.

In particular, the sense amplifier 1" differs from the sense amplifier 1' in that:

the digital/analogue converter 16 is no longer present, and the reference current $I_R$ is constant and independent from the content of the successive approximation register 22, and is generated in the conventional manner by means of a memory cell 56 having the source terminal connected to the ground line 4, the drain terminal connected to the reference line 14, and the gate terminal receiving the reading signal $V_{READ}$;

a switch 58 is arranged between the drain terminal of the PMOS transistor 38 and the node 42;

the non-inverting terminal of the comparator stage 20 is connected to the node 42;

the inverting terminal of the comparator stage 20 is connected to the gate terminals of the PMOS transistors 36, 38, and, via the switch 54, to the node 40;

between the supply line 2 and the node 42, i.e., in parallel to the PMOS transistor 38 and the switch 58, there are connected other three PMOS transistors 60, 62, 64 having respective switches 66, 68, 70 connected in series;

each of the four control signals B3, B2, B1 and B0 supplied by the successive approximation register 22, controls a respective one of the four switches 58, 66, 68 and 70, giving rise to closure when it assumes a first logic level, and opening when it assumes a second logic level.

In particular, the switches 58, 66, 68 and 70 can advantageously be formed of respective PMOS transistors receiving at their gate terminals the control signals B3, B2, B1 and B0, which then control switching on of these PMOS transistors when they assume a low logic level, and switching off when they assume a high logic level.

The PMOS transistors 36, 38, 60, 62, 64 have W/L values which are correlated to one another and can be selected according to two different criteria which allow to obtain different operating modes of the current mirror 18.

In particular, according to the first selection criterion, if a reference W/L value is indicated as S0, the PMOS transistors 36, 38, 60, 62, 64 have the following W/L values: $(W/L)_{36}=15*S0$, $(W/L)_{64}=8*S0$, $(W/L)_{62}=4*S0$, $(W/L)_{60}=2*S0$ and $(W/L)_{38}=S0$, thus determining operation of the current mirror 18 as a current divider, whereas, according to the second selection criterion, the PMOS transistors 36, 38, 60, 62, 64 have respectively the following W/L values: $(W/L)_{36}=S0$, $(W/L)_{64}=8*S0$, $(W/L)_{62}=4*S0$, $(W/L)_{60}=2*S0$ and $(W/L)_{38}=S0$, thus determining operation of the current mirror 18 as a current multiplier.

The mirror ratios deriving from the use of the first selection criterion allow to use small values of the reference current $I_R$, with consequent reduction of energy consumption in the reference branch 12, whereas the mirror ratios deriving from use of the second selection criterion allow to obtain grater accuracy of reading, since the minimum array current $I_M$ is multiplied instead of divided, and is consequently less subject to undesirable disturbances.

The logic levels of the control signals B0–B3 supplied by the successive approximation register 22 are determined on the basis of a dichotomous algorithm very similar to that previously described for the sense amplifier 1.

The main difference between the operation of the sense amplifier 1 and that of the sense amplifier 1' consists in the fact that in the latter the reference current $I_R$ is constant and the value contained in the successive approximation register 22 is used to modify the mirror ratio of the current mirror 18', such as to vary the current injected into the array node 40, and obtained by mirroring the reference current $I_R$ onto the array branch.

By means of the above-described circuit structure, depending on the logic levels of the control signals B0–B3 supplied by the successive approximation register 22, it is possible to inject into the array node 42 a current which is variable between a minimum value equivalent to zero, and a maximum equivalent to $I_M$, if the W/L values of the PMOS transistors 36, 38, 60, 62, 64 are selected according to the first criterion (divider current mirror), and between a minimum value which is equivalent to zero and a maximum value which is equivalent to $15*I_M$, if the W/L values of the PMOS transistors 36, 38, 60, 62, 64 are selected according to the second criterion (multiplier current mirror).

The sense amplifier 1' functions as follows. The reading voltage $V_{READ}$, which is typically 5.5 or 6 V, is applied to the gate terminals of the memory cells 10, 56, and the successive approximation register 22 is controlled such as to set the control signal B3 to a first logic level, and the control signals B2–B0 to a second logic level; by this means therefore, the switch 70 is closed, and the switches 58, 66, 68 are open.

In this situation, the PMOS transistor 64 is connected electrically to the reference node 42, whereas the other PMOS transistors 38, 60, 62 are disconnected electrically from the reference node 42.

The PMOS transistor 64 then injects into the reference node 42 a current which is equivalent to $8/15*I_R$ (ratio between the W/L values of the PMOS transistors 64 and 36), if the W/L values of the PMOS transistors 64 and 36 have been selected according to the first aforementioned criterion, whereas it is equivalent to $8*I_R$, if the W/L values of the PMOS transistors 64 and 36 have been selected according to the second aforementioned criterion.

If the current injected by the PMOS transistor 64 into the reference node 42 is lower than the reference current $I_R$, the reference potential $V_R$ tends to assume values lower than those assumed by the array potential $V_M$, and the logic level consequently assumed by the comparison signal COMP controls the successive approximation register 22, such as to set the control signal B2 also to the first logic level, whereas if the current injected by the PMOS transistor 64 into the reference node 42 is greater than the reference current $I_R$, the reference potential $V_R$ tends to assume values greater than those assumed by the array potential $V_M$, and the logic level consequently assumed by the comparison signal COMP controls the successive approximation register 22 such as to set the control signal B3 to the second logic level, and the control signal B2 to the first logic level.

In the first case, both the switch 70 and the switch 68 are closed, and thus both the PMOS transistor 64 and the PMOS transistor 62 are connected electrically to the reference node 42, whereas in the second case only the switch 68 is closed, and thus only the PMOS transistor 62 is connected to the reference node 42.

In both cases, the PMOS transistor 62 injects into the reference node 42 a current equivalent to $4/15*I_R$ (ratio between the W/L values of the PMOS transistors 62 and 36), if the W/L values of the PMOS transistors 62 and 36 have been selected according to the first aforementioned criterion, or equivalent to $4*I_R$, if the W/L values of the PMOS transistors 62 and 36 have been selected according to the second aforementioned criterion, which current in the first case is added to the current injected by the PMOS transistor 64.

The comparison is then carried out once more between the new values of the array and reference potentials $V_M$ and $V_R$, and the logic levels of the control signals B3–B0 are consequently modified, and by proceeding in this manner with successive approximations, at each comparison step there is determination of the value of one of the four bits stored in the memory cell 10 (dichotomous algorithm), and thus, the four bits stored in the memory cell 10 are written in four steps into the successive approximation register 22.

The advantages of the sense amplifier 1" are as follows.

The structure shown in FIG. 3 allows firstly to save surface area on the silicon, since the space which is necessary for production of the aforementioned PMOS transistors and switches is smaller than that necessary for production of an entire digital/analogue converter, and secondly to obtain greater compactness of the circuit on the silicon, since the aforementioned PMOS transistors and switches can be produced directly on the array branch, instead of separately from the array and reference branches, which, on the other hand, is typically the case for a digital/analogue converter.

In addition, the increased compactness of the circuit which is obtained on the silicon permits further energy saving compared with the conventional sense amplifiers, since the overall path which is followed by the current is shorter than that which it follows when the digital/analogue converter is produced separately, and this gives rise to a consequent lower dissipation of power.

Finally, it is apparent that modifications and variants can be made to the sense amplifiers 1', 1" described and illustrated here, without departing from the protective context of the present invention.

For example, the present invention can be applied without any modification also to sense amplifiers which are dedicated to reading of non-volatile a single bit memory cells, in which the successive approximation register and the digital/analogue converter are not present, and the reference current $I_R$ is generated by a reference memory cell, the content of which is known, and which receives at the gate terminal the reading signal $V_{READ}$.

In addition, the inventive principle on which the present invention is based can also be applied without any modification to sense amplifiers in which it is the reference current $I_R$ which is reflected onto the array branch 6, i.e., to sense amplifiers in which it is the PMOS transistor 38 which is diode-connected. In fact, in this type of sense amplifier, it is sufficient to position the sample and hold stage 50 between the reference node 42 and the input terminal of the comparator stage 20 to which this reference node is connected, and to provide switching off means for switching off the reference branch 12.

Figure 4:
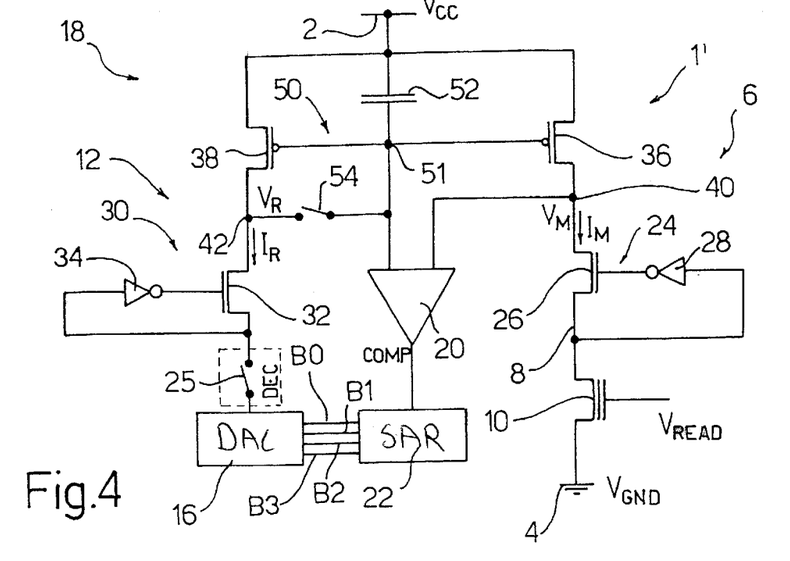
FIG. 4 shows a sense amplifier according to a third embodiment of the present invention.

FIG. 4 shows the circuit diagram of this sense amplifier, in which the various parts are indicated by the same reference numbers as those used in FIG. 2.

In particular, as shown in this Figure, in this type of sense amplifier, the connection of the sample and hold stage 50 is inverted in comparison with that shown in FIG. 2, i.e., the switch 54 is arranged between the reference node 42 and the input terminal of the comparator stage 20 to which this reference node is connected, and this input terminal is then also connected to the gate terminals of the PMOS transistors 36, 38 (node 51), whereas the other input terminal of the comparator stage 20 is connected only to the array node 40. The switching off means 25 for switching off the reference branch 20 can then be formed either of an additional dedicated switch arranged on the reference branch 12 itself, or of the suitably controlled reference column decoding stage.

In the case of this type of sense amplifier also, it is then possible to form a current mirror having a mirror ratio which varies in a manner similar to that previously described with reference to FIG. 3, i.e., by connecting between the supply line 2 and the array node 40 a plurality of PMOS transistors, via corresponding switches which are controlled by the control signals B3–B0 supplied by the successive approximation register 22.

Figure 5:
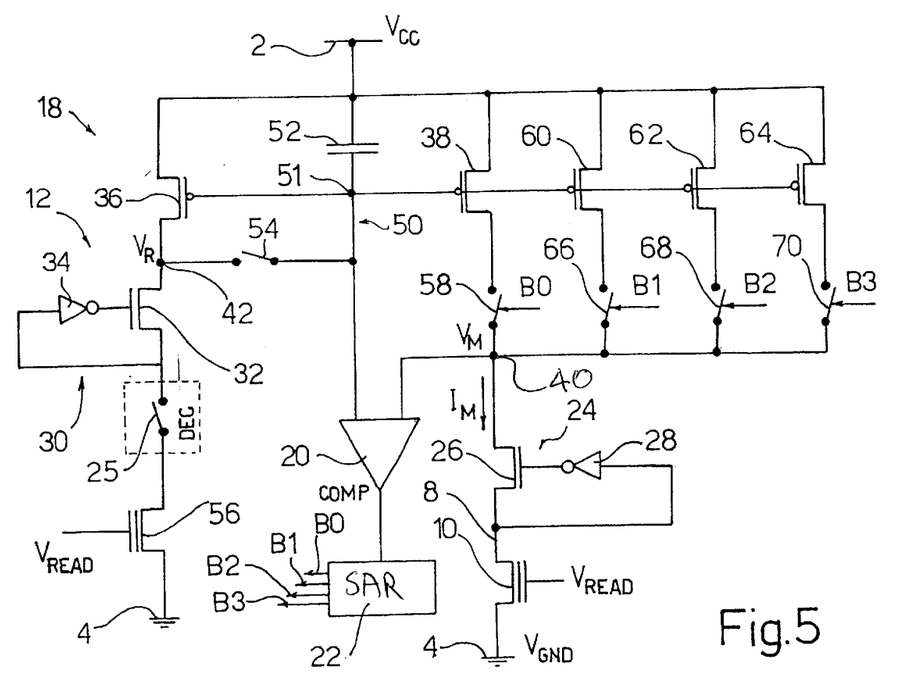
FIG. 5 shows a sense amplifier according to a fourth embodiment of the present invention.

FIG. 5 shows a sense amplifier of the above-described type, in which the various parts are indicated by the same reference numbers as those used in FIG. 3.

We claim:

1. Reading circuit for a non-volatile memory, comprising: a first branch connected to a first current generator; a second branch connected to a second current generator; a current/voltage converter connected to said first and second branch and supplying at a first and second node respectively a first and a second electrical potential correlated to currents flowing respectively in said first and said second branch; a comparator having a first and a second input connected to said first and second node for comparing said first and second electrical potential; a sample and hold stage arranged between said first node and said comparator and selectively operable to sample and hold said first potential; and a switch for switching off said first branch.

2. Reading circuit according to claim 1, wherein said current/voltage converter further comprises a reference line set to a reference potential; and a current mirror connected between said reference line and said first and second nodes, and having an internal node connected to said first input of said comparator; and wherein said sample and hold stage further comprises charge storage element arranged between said reference line and said internal node of said current mirror, and a first switch arranged between said first node and said internal node of said current mirror.

3. Reading circuit according to claim 2, wherein said charge storage device further comprises a capacitor.

4. Reading circuit according to claim 2, wherein said current mirror has a fixed mirror ratio, and further comprises first and second transistors having first terminals connected to said reference line, second terminals connected respectively to said first and said second node, and control terminals connected to one another and to said first input of said comparator, and defining said internal node.

5. Reading circuit according to claim 4, wherein said first current generator further comprises a first memory cell, and said second current generator further comprises a second memory cell.

6. Reading circuit according to claim 4, wherein said first current generator further comprises a third, multi-level memory cell; and said second current generator further comprises a first successive approximation register having an input connected to an output of said comparator, and a plurality of outputs supplying corresponding first control signals; and an analogue/digital converter having a plurality of inputs connected to corresponding ones of said outputs of said first successive approximation register, and an output connected to said second branch.

7. Reading circuit according to claim 4, wherein said second current generator further comprises a fourth multi-level memory cell; and said first current generator further comprises a second successive approximation register having an input connected to an output of said comparator , and a plurality of outputs supplying corresponding second control signals; and a digital/analogue converter having a plurality of inputs connected to corresponding ones of said outputs of said second successive approximation register, and an output connected to said first branch.

8. Reading circuit according to claim 2, wherein said first current generator further comprises a fifth multi-level memory cell; said second current generator further comprises a sixth memory cell; and said current mirror has a variable reflection ratio.

9. Reading circuit according to claim 8, wherein said current mirror further comprises a third transistor having a first terminal connected to said reference line, a second terminal connected to said first node, and a control terminal connected to said first input of said comparator; and a plurality of fourth transistors, of a number equivalent to the number of bits stored in said fifth memory cell, having control terminals connected to one another and to said control terminal of said third transistor, and defining, together with said third transistor, said internal node; first terminals connected to said reference line; and second terminals connected to said second node, via respective third switches receiving respective third control signals at control terminals.

10. Reading circuit according to claim 9, further comprising a third successive approximation register having an input connected to an output of said comparator and a plurality of outputs supplying said third control signals.

11. Reading circuit according to claim 2, wherein said first current generator further comprises a seventh memory cell; said second current generator further comprises an eighth multi-level memory cell; and said current mirror has a variable reflection ratio.

12. Reading circuit according to claim 11, wherein said current mirror further compromises a fifth transistor having a first terminal connected to said reference line, a second terminal connected to said first node, and a control terminal connected to said first input of said comparator; and a plurality of sixth transistors, of a number equivalent to the number of bits stored in said eighth memory cell, having control terminals connected to one another and to said control terminal of said fifth transistor, and defining, together with said fifth transistor, said internal node; first terminals connected to said reference line; and second terminals connected to said node, via respective fourth switches receiving corresponding fourth control signals at control terminals.

13. Reading circuit according to claim 12, further comprising a fourth successive approximation register having an input connected to an output of said comparator, and a plurality of outputs supplying said fourth control signals.

14. Reading circuit according to claim 1, wherein said switch comprises a switch arranged on said first branch.

15. Reading circuit according to claim 14, said switch is defined by a branch decoding stage.

16. Reading method for a non-volatile memory, implemented by means of a reading circuit comprising a first branch in which a first current flows, and a second branch in which a second current flows; said reading method comprising:

converting said first current into a first electrical potential;
converting said second current into a second electrical potential;
comparing said first and second electrical potentials;
sampling and holding said first electrical potential; and
switching off said first branch of said reading circuit.

17. Reading method according to claim 16, said first branch is an array branch and said second branch is a reference branch.

18. Reading method according to claim 17, for a reading circuit comprising a memory cell connected to said first branch; wherein said switching off said first branch of said reading circuit further comprises switching off said memory cell.

19. Reading method according to claim 18, wherein said switching off said memory cell further comprises zeroing a reading voltage supplied to a gate terminal of said memory cell.

20. A reading circuit for reading the content of an array memory cell, the reading circuit comprising:

an array branch coupled via an array bit line to the array memory cell the content of which is to be read;
a reference branch coupled via a reference bit line to a current generator stage supplying a reference current;
a current/voltage converter stage coupled to said array branch and to said reference branch, said current/voltage converter stage coupled to supply at an array node and at a reference node respectively an array potential and a reference potential correlated to the currents flowing respectively in said array branch and in said reference branch;

a comparator stage coupled to said array node and said reference node for comparing said array and reference potentials;

a sample and hold stage arranged between said array node and said comparator stage and selectively operable to sample and hold said array potential; and a switching off stage coupled to switch off said array branch.

21. The reading circuit according to claim 20, wherein said current/voltage converter further comprises:

a reference line set to a reference potential;

a current mirror coupled between said reference line and said array and reference nodes;

an internal node coupled to said array node and forming a first input of said comparator stage;

said sample and hold stage formed of a charge storage device arranged between said reference line and said internal node of said current mirror means, and a controlled switch arranged between said array node and said internal node of said current mirror.

22. The reading circuit according to claim 21, wherein said current mirror is formed having a fixed mirror ratio, and further comprises a plurality of transistors having source terminals connected to said reference line, drain terminals connected respectively to said array and said reference nodes, and control terminals connected to one another and to said first input of said comparator, and defining said internal node.

23. A reading method for a non-volatile memory, implemented by means of a reading circuit comprising a first branch in which a first current flows, and a second branch in which a second current flows, said reading method comprising:

mirroring said first current onto said second branch by generating sufficient voltage in a current/voltage converter stage to cause a current equivalent to said first current to flow;

sampling and holding said mirrored current for a predetermined period; and de-coupling said first branch.

24. The reading method according to claim 23, further comprising applying a reading voltage to a memory cell, the contents of which are to be read, during a period sufficiently long to stabilize said voltage generated in said current/voltage converter stage.

25. The reading method according to claim 24, further comprising zeroing said reading voltage.

* * * * *